United States Patent
Srinivasan et al.

(10) Patent No.: US 11,442,108 B1
(45) Date of Patent: Sep. 13, 2022

(54) ISOLATION LOGIC TEST CIRCUIT AND ASSOCIATED TEST METHOD

(71) Applicant: STMicroelectronics International N.V., Geneva (CH)

(72) Inventors: Venkata Narayanan Srinivasan, Greater Noida (IN); Gourav Garg, Kaithal (IN); Dhulipalla Phaneendra Kumar, Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/477,237

(22) Filed: Sep. 16, 2021

(51) Int. Cl.
  *G01R 31/3185* (2006.01)
  *G01R 31/317* (2006.01)
(52) U.S. Cl.
  CPC ........ *G01R 31/318575* (2013.01); *G01R 31/31713* (2013.01); *G01R 31/318555* (2013.01)
(58) Field of Classification Search
  CPC ...... G01R 31/318575; G01R 31/31713; G01R 31/318555
  See application file for complete search history.

(56) References Cited

U.S. PATENT DOCUMENTS

| | | | |
|---|---|---|---|
| 8,001,433 B1 * | 8/2011 | Bhatia | G01R 31/318563 716/136 |
| 10,310,013 B2 | 6/2019 | Ge et al. | |
| 10,955,472 B1 * | 3/2021 | Track | G01R 31/31721 |
| 11,047,909 B2 | 6/2021 | Kukreja et al. | |
| 11,119,153 B1 * | 9/2021 | Srinivasan | G01R 31/31721 |
| 2010/0019774 A1 | 1/2010 | Wu et al. | |
| 2012/0216089 A1 * | 8/2012 | Chen | G01R 31/3177 700/121 |
| 2018/0164376 A1 * | 6/2018 | Ge | G01R 31/31701 |

OTHER PUBLICATIONS

C. C. -. Hsu and C. H. -. Wen, "Speeding up power verification by merging equivalent power domains in RTL design with UPF," 2017 International Test Conference in Asia (ITC—Asia), Taipei, Taiwan, 2017, pp. 168-173. (Year: 2017).*

Galbi, D. et al., "Advanced Low Power, Multi-Supply Implementation Techniques for 65nm and Beyond using DCT and ICC," SNUG Boston, 2007, 26 pages.

(Continued)

*Primary Examiner* — Cynthia Britt
(74) *Attorney, Agent, or Firm* — Slater Matsil, LLP

(57) ABSTRACT

A circuit includes: a first power domain including: an isolation cell, a first selection circuit having inputs for receiving a first functional signal and a first test signal and an output for controlling the isolation cell, and a second selection circuit having inputs for receiving a second functional signal and a second test signal and an output coupled to a signal input of the isolation cell; a second power domain including: a first circuit having an input coupled to a signal output of the isolation cell, a first observation element coupled to the signal output of the isolation cell, and a second observation element coupled to an output of the first circuit; where, when in test mode, the first selection circuit controls the isolation cell based on the first test signal, and the second selection circuit provides the second test signal to the signal input of the isolation cell.

24 Claims, 6 Drawing Sheets

(56) References Cited

OTHER PUBLICATIONS

Lin, X., "Low Power Testing—What Can Commercial Design-for-Test Tools Provide?," Journal of Low Power Electronics and Applications, ISSN 2079-9268, Dec. 9, 2011, 16 pages.
Patel, M. et al., "Low Power Design for Testability," https://www.design-reuse.com/articles/32262/low-power-design-for-testability.html, Aug. 25, 2021, 10 pages.
Prasad, D. et al., "Writing Reusable UPF For RTL And Gate-Level Low Power Verification," Semiconductor Engineering, Aug. 8, 2019, 16 pages.
Synopsys, "Power Compiler™ User Guide," Version D-2010.03-SP2, Jun. 2010, 453 pages.
VLSI Tutorials, "Isolation cells and Level Shifter cells," https://vlsitutorials.com/isolation-cells-level-shifter-cells-low-power-vlsi/. Aug. 25, 2021, 4 pages.

\* cited by examiner

Prior Art

Prior Art
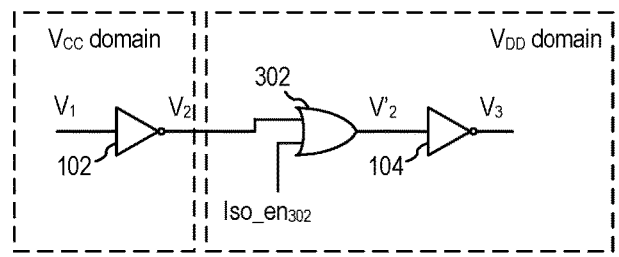
FIG. 3
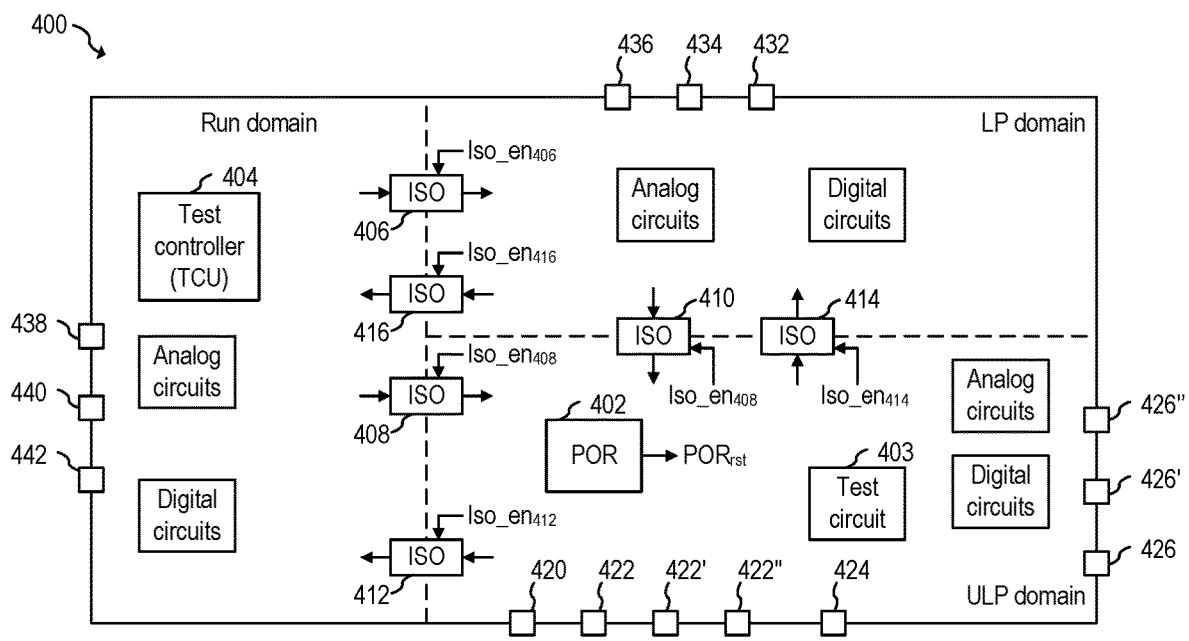
FIG. 4
FIG. 5

| Mode or isolation test No. | Inputs ||||||||| Outputs ||| |
|---|---|---|---|---|---|---|---|---|---|---|---|---|
| | TESTBIT0 | TESTBIT1 | TESTBIT2 | TESTBIT3 | TESTBIT4 | TESTBIT5 | 422 | One of other 422 | All of 422 | 438 | 440 | TCU status |
| Functional mode | 0 | 0 | X | 0 | 0 | 0 | F | F | F | F | F | Reset |
| ATPG mode | X | X | X | 1 | 1 | X | P | P | P | P | P | ATPG mode |
| 1 | 1 | 1 | 1 | 1 | 0 | 1 | 0 | 1 | N/A | 0 | 1 | Not in reset |
| 2 | 1 | 1 | 1 | 1 | 0 | 1 | 1 | 0 | N/A | 0 | 1 | Not in reset |
| 3 | 1 | 1 | 0 | 1 | 0 | 1 | 1 | 1 | 1 | 0 | 1 | Not in reset |
| 4 | 1 | 1 | 0 | 0 | 0 | 1 | 1 | 1 | 1 | 0 | 0 | Reset |
| 5 | 1 | 1 | 0 | 0 | 0 | 1 | 1 | 1 | 1 | 0 | 1 | Not in reset |
| 6 | 1 | 1 | 0 | 1 | 0 | 1 | 1 | 1 | 1 | 1 | 1 | Not in reset |
| 7 | 1 | 1 | 1 | 0 | 0 | 1 | 0 | 0 | 0 | 0 | 0 | Reset |
| 8 | 1 | 1 | 1 | 0 | 0 | 1 | 0 | 0 | 0 | 0 | 1 | Not in reset |

…

ISOLATION LOGIC TEST CIRCUIT AND ASSOCIATED TEST METHOD

TECHNICAL FIELD

The present disclosure relates generally to an electronic system and method, and, in particular embodiments, to isolation logic test circuit and associated test method.

BACKGROUND

The state of a signal originating from an unpowered logic circuit is generally indeterminate (usually referred to by the symbol "X"). If such signal is fed to an active logic circuit, the active logic circuit may operate improperly. For example, FIGS. 1A and 1B show a schematic diagram of two inverters (102 and 104) connected in series, and associated waveforms, respectively.

As shown in FIG. 1A, inverter 102 is powered by supply voltage $V_{CC}$ and inverter 104 is powered by supply voltage $V_{DD}$. As shown in FIG. 1B, when supply voltages $V_{CC}$ and $V_{DD}$ are both powered (before time $t_1$), signal $V_2$ is an inverter version of signal $V_1$ and signal $V_3$ is an inverted version of signal $V_2$. When inverter 102 becomes unpowered (when supply voltage $V_{CC}$ is low, such as at time $t_1$), voltages $V_2$ and $V_3$ become indeterminate.

To avoid an indeterminate state of signal $V_3$, an isolation circuit, also referred to as an isolation cell, may be used. For example, FIGS. 2A and 2B show a schematic diagram of inverters 102 and 104 connected in series and having isolation cell 202 between them, and associated waveforms, respectively. As shown in FIG. 2A, inverters 102 and 104, and AND gate 202 are drawn symbolically. As also shown in FIG. 2A, inverter 102 is powered by supply voltage $V_{CC}$ and inverter 104 and AND gate 202 are powered by supply voltage $V_{DD}$.

AND gate 202 operates as an isolation cell (here referred to as isolation cell 202). For example, when the isolation cell 202 is disabled (when signal Iso_en$_{202}$ is 1), signal V'$_2$ is equal to signal $V_2$. When isolation cell 202 is enabled (when Iso_en$_{202}$ is 0), signal V'$_2$ is 0 regardless of the state of signal $V_2$. Isolation cell 202 may be enabled when inverter 102 becomes unpowered (when $V_{CC}$ becomes low). Such behavior is illustrated in FIG. 2B.

As illustrated by FIGS. 2A and 2B, the use of isolation cell 202 allows for the avoidance of indeterminate states in the output of inverter 104 when supply voltage $V_{CC}$ is unpowered.

FIG. 2A shows a possible implementation of an isolation cell that generates a 0 when enabled. It is possible to implement isolation cells that generate a 1 when enabled. For example, FIG. 3 shows show a schematic diagram of inverters 102 and 104 connected in series and having isolation cell 302 between them. As shown in FIG. 3, the supply terminals of logic gates 102, 104 and 302 have been omitted and the power domains are indicated instead, for clarity purposes.

As can be seen in FIG. 3, when isolation 302 is disabled (when signal Iso_en$_{302}$ is 0), signal V'$_2$ is equal to signal $V_2$. When isolation cell 202 is enabled (when Iso_en$_{202}$ is 1), signal V'$_2$ is 1 regardless of the state of signal $V_2$. Isolation cell 202 may be enabled when inverter 102 becomes unpowered (when $V_{CC}$ becomes low).

Integrated circuits (IC) having multiple power domains generally use isolation cells for signals propagating from an unpowered domain to an always-on domain (a power domain that is powered as long as the IC is powered).

SUMMARY

In accordance with an embodiment, an electronic circuit includes: a first power domain including: a first isolation cell including a signal input, a signal output, and a control input, where the first isolation cell is configured to be enabled or disabled based on the control input of the first isolation cell, a first selection circuit having a first input configured to receive a first functional signal, a second input configured to receive a first test signal, and an output coupled to the control input of the first isolation cell, and a second selection circuit having a first input configured to receive a second functional signal, a second input configured to receive a second test signal, and an output coupled to the signal input of the first isolation cell; a second power domain including: a first circuit having an input coupled to the signal output of the first isolation cell, a first observation element coupled to a first intermediate node that is coupled between the signal output of the first isolation cell and the input of the first circuit, and a second observation element coupled to an output of the first circuit; where the electronic circuit includes a plurality of functional modes, and a first test mode; where, for each of the plurality of functional modes, the first power domain is configured to be on when the second power domain is on, and the second power domain is configured to be off in at least one functional mode in which the first power domain is configured to be on; where, when the electronic circuit is in the first test mode, the first selection circuit is configured to provide the first test signal to the control input of the first isolation cell, and the second selection circuit is configured to provide the second test signal to the signal input of the first isolation cell; and where, when the electronic circuit is in any of the plurality of functional modes, the first selection circuit is configured to provide the first functional signal to the control input of the first isolation cell, and the second selection circuit is configured to provide the second functional signal to the signal input of the first isolation cell.

In accordance with an embodiment, an integrated circuit including: a first power domain including: a power-on-reset (POR) circuit configured to generate a POR signal, where the POR circuit is configured to assert the POR signal when a first supply voltage of the first power domain reaches a predetermined threshold; a first isolation cell including a signal input, a signal output, and a control input, where the first isolation cell is configured to be enabled or disabled based on the control input of the first isolation cell, a first selection circuit having a first input configured to receive a first functional signal, a second input configured to receive a first test signal, and an output coupled to the control input of the first isolation cell, and a second selection circuit having a first input configured to receive the POR signal, a second input configured to receive a second test signal, and an output coupled to the signal input of the first isolation cell; a second power domain including: a test controller having an input coupled to the signal output of the first isolation cell, a first pin or pad coupled to a first intermediate node that is coupled between the signal output of the first isolation cell and the input of the test controller, and a second pin or pad coupled to an output of the test controller; where the integrated circuit includes a plurality of functional modes, and a first test mode; where, for each of the plurality of functional modes, the first power domain is configured to be on when the second power domain is on, and the second power domain is configured to be off in at least one functional mode in which the first power domain is configured to be on; where, when the integrated circuit is in the first test mode, the first selection circuit is configured to provide the first test signal to the control input of the first isolation cell, and the second selection circuit is configured to provide the second test signal to the signal input of the first isolation cell; and where, when the integrated circuit is in any of the plurality of functional modes, the first selection circuit is configured to provide the first functional signal to the control input of the first isolation cell, and the second selection circuit is configured to provide the POR signal to the signal input of the first isolation cell.

In accordance with an embodiment, a method for testing an integrated circuit having a plurality of power domains, a plurality of functional modes, and a first test mode, the method including, during the first test mode: causing a first selection circuit having a first input for receiving a first functional signal, a second input for receiving a first test signal, and an output coupled to a control input of a first isolation cell, to deliver the first test signal to the control input of the first isolation cell; causing a second selection circuit having a first input for receiving a second functional signal, a second input for receiving a second test signal, and an output coupled to a signal input of the first isolation cell, to deliver the second test signal to the signal input of the first isolation cell, where a first power domain of the plurality of power domains includes the first and second selection circuits and the first isolation cell; setting the second test signal to logic 1; asserting the first test signal to enable the first isolation cell; after setting the second test signal to logic 1 and asserting the first test signal, measuring a first voltage at a first pin or pad coupled to a signal output of the first isolation cell, where a second power domain of the plurality of power domains includes the first pin or pad, where, for each of the plurality of functional modes, the first power domain is on when the second power domain is on, and the second power domain is off in at least one functional mode in which the first power domain is on; setting the second test signal to logic 0; deasserting the first test signal to disable the first isolation cell; after setting the second test signal to logic 0 and deasserting the first test signal, measuring a second voltage at the first pin or pad; setting a first test bit of the first power domain to logic 0, where the first test bit is coupled to a first input of an OR gate, the OR gate having a second input coupled to the signal output of the first isolation cell and to the first pin or pad, and an output coupled to an input of a test controller, where the second power domain includes the OR gate and the test controller; after setting the second test signal to logic 0, deasserting the first test signal, and setting the first test bit to logic 0, measure a third voltage at a second pin or pad coupled to an output of the test controller, where the second power domain includes the second pin or pad; when the first voltage corresponds to logic 0, the second voltage correspond to logic 0, and the third voltage is indicative of the test controller being in reset mode, generating a first indication that a first path coupled to the signal input of the first isolation cell does not have stuck-at 1 faults, and that a second path coupled to the signal output of the first isolation cell does not have stuck-at 1 faults; when the first voltage corresponds to logic 0 and the second voltage correspond to logic 1, generating a second indication that the first path has a stuck-at 1 fault; and when the first voltage corresponds to logic 0, the second voltage correspond to logic 0, and the third voltage is indicative of the test controller not being in reset mode, generating a third indication that the second path has a stuck-at 1 fault.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 shows show a schematic diagram of two inverters connected in series and having an isolation cell between them;

FIG. 4 shows a schematic diagram of an IC with multiple power domains, according to an embodiment of the present invention;

FIG. 5 shows a table illustrating the state of some power domains of the IC of FIG. 4 in different power modes of the IC of FIG. 4, according to an embodiment of the present invention;

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1A:
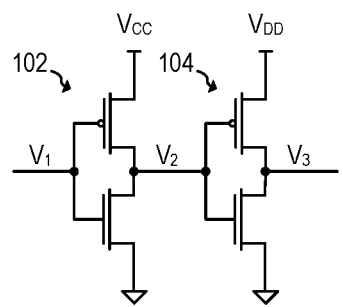
FIGS. 1A and 1B show a schematic diagram of two inverters connected in series, and associated waveforms, respectively.
Figure 1B:
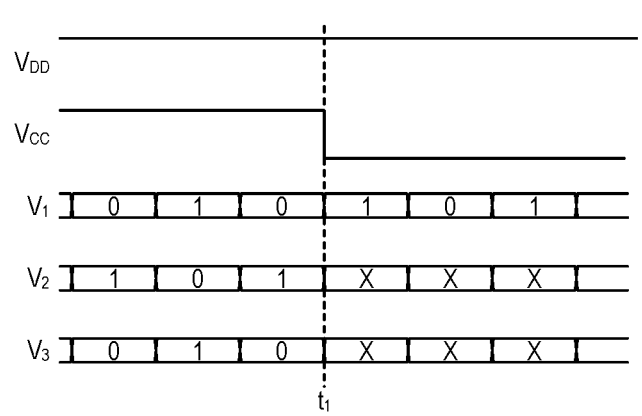
Figure 2A:
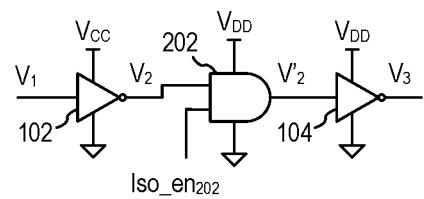
FIGS. 2A and 2B show a schematic diagram of two inverters connected in series and having an isolation cell between them, and associated waveforms, respectively.
Figure 2B:
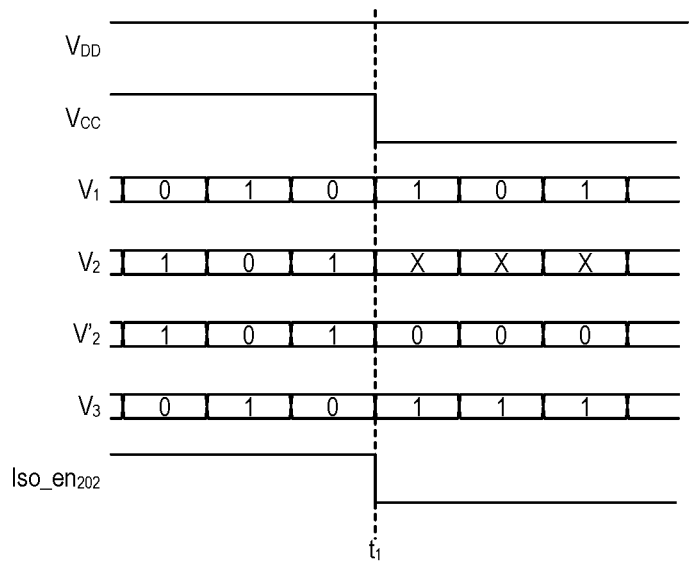

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, an integrated circuit (IC) having a plurality of power domains and including isolation cells for signals traveling from a powered domain to an unpowered domain, and including a power-on-reset (POR) circuit, and associated isolation cells test method. Some embodiments may be implemented in circuits without a POR circuit and/or for signals unrelated to the POR circuit. In some embodiments, one or more test methods may be performed during IC design simulation, IC characterization, IC debug, IC production, and/or in the field.

In an embodiment of the present invention, a test circuit is used to determine missing isolation cells, wrongly connected isolation cells, and the location of stuck-at 1 faults in the signal path going through the isolation cells. In some embodiments, the test circuit is inserted in register-transfer level code (RTL), while the isolation cells are inserted automatically by the synthesis tools based on RTL as well as unified power format (UPF).

FIG. 4 shows a schematic diagram of IC 400, according to an embodiment of the present invention. IC 400 includes three different power domains: ultra-low power (ULP) domain, low power (LP) domain, and Run domain. IC 400 includes POR circuit 402 in the ULP domain and test controller 404 in the Run domain. IC 400 also includes a plurality of isolation cells (406, 408, 410, 412, 414, 416). IC 400 may also include one or more analog circuits and/or one or more digital circuits. Example of such analog circuits include PLLs, OTP, NVM, etc.

POR circuit 402 is configured to monitor power level(s) of ULP domain and assert a reset signal ($POR_{rst}$) when power supply level(s) of the ULP domain (e.g., the output of a bandgap or always-on LDO) reach (respective) threshold voltage(s) (when the ULP domain is powered). Reset signal $POR_{rst}$ is configured, upon assertion, to reset analog and/or digital circuits of the ULP domain to initialize such blocks to a known state. In some embodiments, POR circuit 402 may be implemented in any way known in the art.

As will be described in more detail later, in some embodiments, signal $POR_{rst}$ may also be used to reset analog and/or digital circuits in power domains different from the ULP domain (e.g., LP domain and/or Run domain).

Test controller 404 is configured to perform or help perform tests to one or more circuits of IC 400. For example, in some embodiments, test controller 404 may include a conventional automatic test pattern generator (ATPG) for running test patterns in a known manner to detect faults associated with one or more circuits of IC 400. In some embodiments, test controller 404 may also include a joint test action group (JTAG) interface, which may be implemented in any way known in the art.

IC 400 may include a plurality of pins and/or pads. For example, FIG. 4 illustrates pins or pads 420, 422, 422', 422", 424, 426, 426', 426", 432, 434, 436, 438, 440, and 442. Fewer pins or pads, or more pins or pads may also be used.

As shown in FIG. 4, in some embodiments, pins or pads 420, 422, 422', 422", 424, 426, 426', and 426" are accessible by circuits in the ULP domain in all power modes and by circuits in other domains when the domain is powered (e.g., by circuits in the LP domain in all power modes except in the standby mode and by circuits in the RUN domain when in RUN mode and in other power modes if powered). Pins or pads 432, 434, and 436 are accessible by circuits in the LP domain and the ULP domain, by circuits in the RUN domain when in RUN mode and in other power modes if powered. Pins or pads 438, 440, and 442 are accessible by circuits in the Run domain, LP domain and ULP domain.

One or more of isolation cells 406, 408, 410, 412, 414, 416 may be implemented in any way known in the art (e.g., as isolation cells 202 or 302). In some embodiments, isolation cells 408, 412, 410 and 414 are powered from the ULP domain, and isolation cells 406 and 416 are powered from the LP domain.

As shown, in some embodiments, IC 400 include three different power domains. In some embodiments, IC 400 may have only two different power domains. In some embodiments, IC 400 may have three or more different power domains.

In some embodiments, the ULP domain is designed to be an always-on power domain, the LP domain is designed to be on in all power modes except standby, and the Run domain is designed to be on only in the Run power mode. For example, FIG. 5 shows table 500 illustrating the state of some power domains of IC 400 in different power modes of IC 400, according to an embodiment of the present invention.

As illustrated in FIG. 5, there is at least one state in which signals crossing from the LP domain to the ULP domain cross from an unpowered domain to a powered domain. There is at least one state in which signals crossing from the Run domain to the ULP domain cross from an unpowered domain to a powered domain. There is at least one state in which signals crossing from the Run domain to the LP domain cross from an unpowered domain to a powered domain.

In some embodiments, all signals crossing from an unpowered domain to a powered domain go through an isolation cell to avoid causing an uncertain state in a circuit of the powered domain. For example, in some embodiments, all signals crossing from the Run domain to the LP domain go through a respective isolation cell, all signals crossing from the Run domain to the ULP domain go through a respective isolation cell, and all signals crossing from the LP domain to the ULP domain go through a respective isolation cell. Isolation cells 406, 408, and 410 are illustrative of isolation cells for signals crossing from an unpowered domain to a powered domain.

In some embodiments, some signals crossing from a powered domain to an unpowered domain may cross the domains without going through an isolation cell (e.g., as there may be no risk of causing an uncertain state in the unpowered domain). As will be described in more detail later, some embodiments may benefit from having isolations cells for at least some (e.g., critical) signals crossing from a powered domain to an unpowered domain. Isolation cells 412, 414, and 416 are illustrative of isolation cells for signals crossing from a powered domain to an unpowered domain.

Examples of signals crossing from a powered domain to an unpowered domain that may benefit from having an isolation cell includes reset signals, enable signals, and power-ok signals. For example, in some embodiments, unpowered domains (e.g., LP, Run) may be implemented without a POR circuit. Upon power-up of IC 400, POR circuit 402 resets the logic in the ULP domain (e.g., using signal $POR_{rst}$). In some embodiments, signal $POR_{rst}$ is routed to the LP domain and/or Run domain via isolation cells (e.g., 414, 412, respectively) to reset the logic on the LP/Run domains when the LP/Run domain powers up.

In some embodiments, isolation cells routing signals from a powered domain to an unpowered domain may be disabled only when the unpowered domain powers up. For example, in some embodiments, signal $POR_{rst}$ goes through isolation cell 412, isolation cell 412 remains enabled until the Run domain powers up, and, after the Run domain powers up, isolation cell 412 is disabled. Since isolation cell 412 is enabled until the Run domain powers up, the logic circuits of the Run domain are in a known (e.g., default) state when the Run domain powers up.

It is not uncommon that, during the design of an IC, an isolation cell is missed (e.g., particularly isolation cells for signals crossing from a powered domain to an unpowered domain), and/or an enable signal ($Iso\_en_{4xx}$) being connected to the wrong isolation cell. In some embodiments, test circuit 403 is configured to detect missing isolation cells and/or detect wrong connection/placement of an isolation cells. In some embodiments, test circuit 403 may be configured to detect stuck-at 1 faults on buffers having an input coupled to an output of an isolation cell and/or detect stuck-at 1 faults on buffers having an output coupled to an input of an isolation cell.

Figure 6:
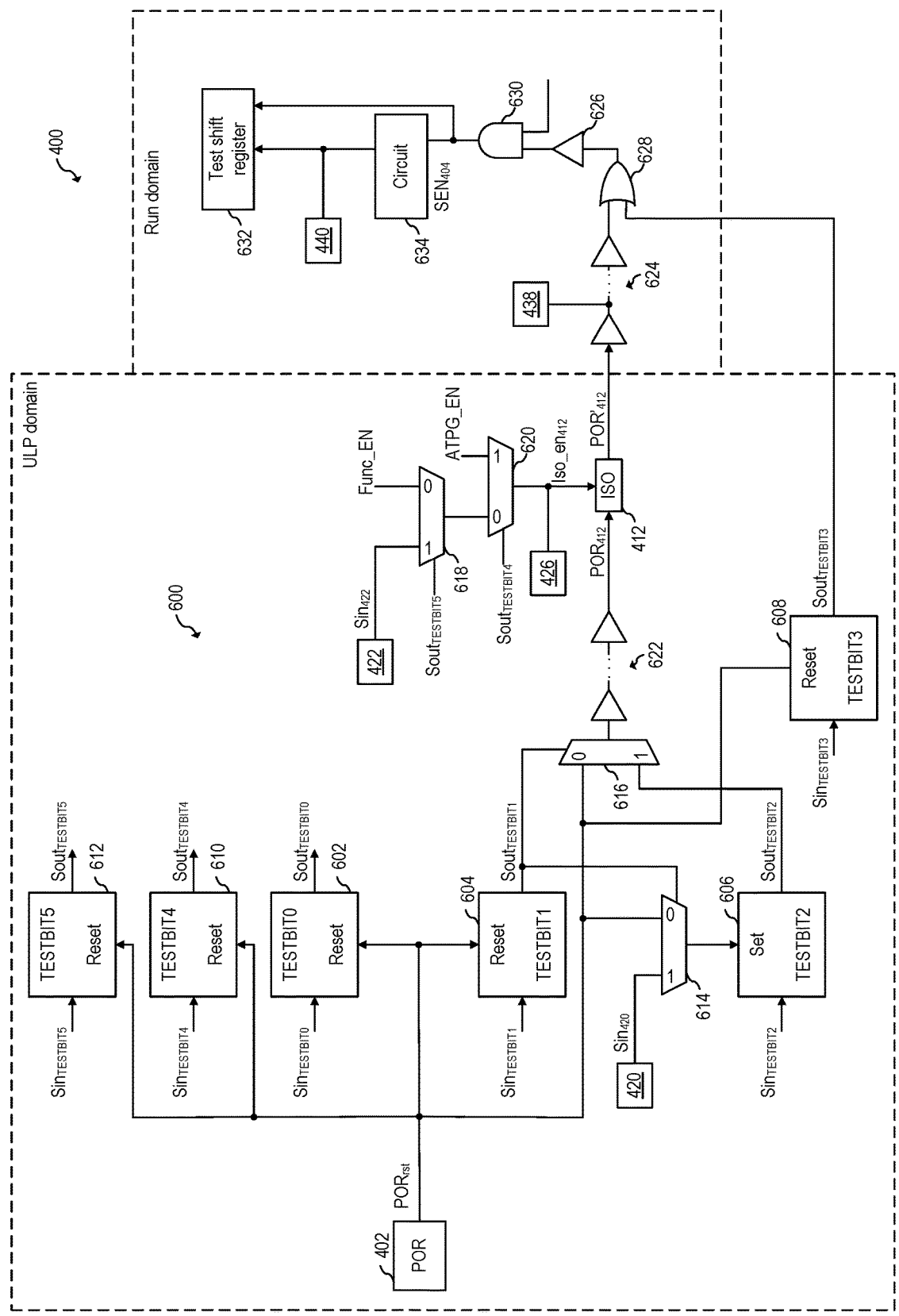
FIG. 6 shows a schematic diagram of a test circuit, according to an embodiment of the present invention.
Figures 7, 8:
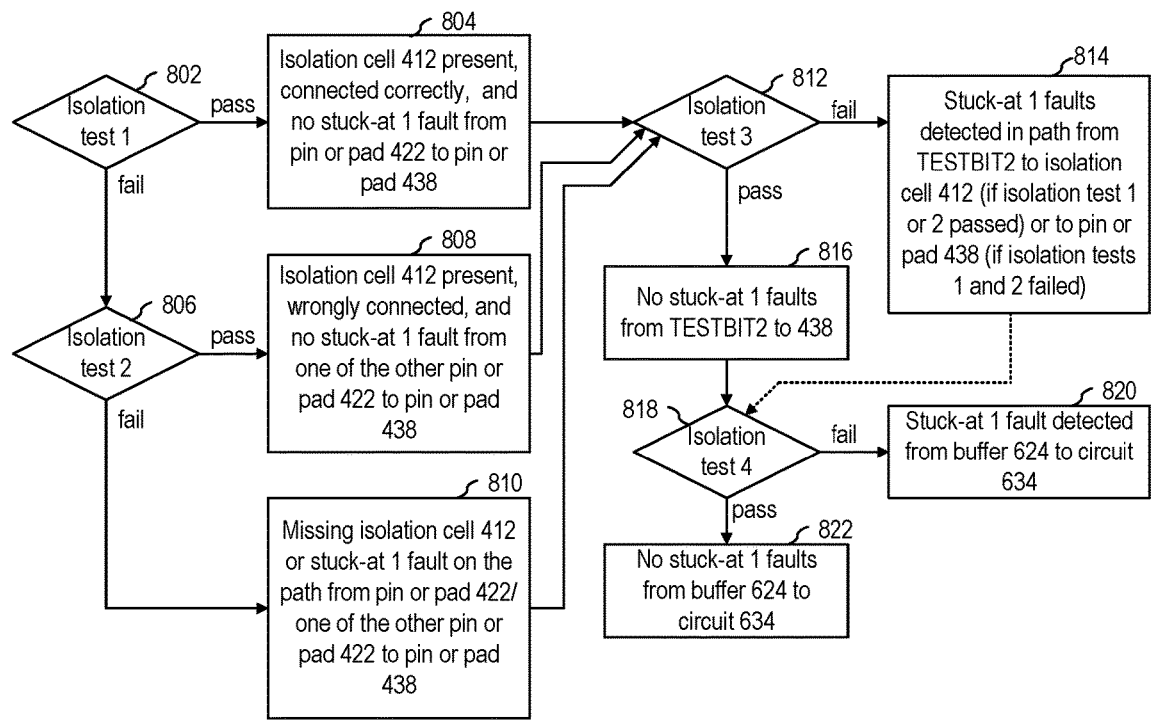
FIG. 7 shows a table illustrating various test modes of the IC of FIG. 4, according to an embodiment of the present invention.
FIG. 8 shows a flow chart of an embodiment method for testing an isolation cell, according to an embodiment of the present invention.

FIG. 6 shows a schematic diagram of test circuit 600, according to an embodiment of the present invention. Test circuit 403 may be implemented as test circuit 600. FIG. 7 shows table 700 illustrating various test modes of IC 400, according to an embodiment of the present invention. FIGS. 6 and 7 may be understood together.

Test circuit 600 includes a plurality of test bits (602, 604, 606, 608, 610, 612), and multiplexers (MUXes) 614, 616, 618, 620. The plurality of test bits may be programmed, e.g., by using JTAG, or using any other conventional digital communication protocol. In some embodiments, one or more test bits of the plurality of test bits may be controlled by pins or pads of IC 400.

Circuit 634 may be a digital or analog circuit. For example, in some embodiments, circuit 634 may correspond to a digital circuit, such as test controller 404. In some embodiments, circuit 634 may correspond to an analog circuit, such a clock sources (e.g., oscillators, or PLLs) or memories (NVM [non-volatile memory] or Fuses [one time programmable]). For illustrative purposes, FIG. 7 assumes that circuit 634 corresponds to test controller 404.

FIG. 6 illustrates test circuit 600 for a single isolation cell (412 in this example), which, in this example, is coupled to test circuit 634. Similar circuits may be implemented for other isolation cells, e.g., that may be coupled (e.g., for resetting purposes) to other digital circuits. For example, pins or pads 422' and 422" are illustrative of a typical input pin or pad for other isolation cell (e.g., 414 or 416) of IC 400. For example, pin or pad 422' may be coupled through MUXes 618' and 620' (e.g., arranged similarly to MUXes 618 and 620) to control another isolation cell (e.g., 414), and pin or pad 422" may be coupled through MUXes 618" and 620" (e.g., arranged similarly to MUXes 618 and 620) to control another isolation cell (e.g., 416). A similar arrangement (e.g., using a pin or pad via MUXes 618, 620 for controlling an isolation enable signal, and using pin or pads for observing signals during isolation tests) may be used for isolation cells, e.g., all isolation cells of IC 400. IC 400 may include a plurality of pins or pads 422 for controlling, during isolation test mode, respective isolation cells of IC 400.

As shown in FIG. 6, in some embodiments, buffers 622, 624, and 626, may be in the path of signal $POR_{rst}$. Such buffers, as well as other elements in the path of signal $POR_{rst}$, may be susceptible to stuck-at 1 faults.

During normal operation (during functional mode), signal $POR_{rst}$ is asserted (e.g., low) during power-up while the supply levels of the ULP domain are below a predetermined threshold, and is deasserted (e.g., high) once the supply levels of the ULP domain reach the predetermined threshold. Upon assertion of signal $POR_{rst}$, test bits 602 (TESTBIT0), 604 (TESTBIT1), 608 (TESTBIT3), 610 (TESTBIT4), and 612 (TESTBIT5) are reset (e.g., low). Thus, during normal operation, signal $POR_{rst}$ flows to isolation cell 412 ($POR_{rst}=POR_{412}$), where the isolation cell is controlled (enabled/disabled) by signal Func_EN. When signal Func_EN is deasserted to disable isolation cell 412, signal $POR_{rst}$ flows to circuit 634 ($POR_{rst}=POR_{412}=POR'_{412}$), e.g., thereby causing the reset of circuit 634 to a known state.

By using isolation cells from powered domains to unpowered domains, such as for signals originating from POR circuit 402, some embodiments may implement a (e.g., single) POR circuit in the always-on power domain (e.g., ULP) and may advantageously omit POR circuits in the other power domains (e.g., LP domain, Run domain) by using signals from POR circuit 402 (e.g., $POR_{rst}$), routed via isolation cells (e.g., 412, 414), to reset circuits in the unpowered domains by the enabling of the associated isolation cells, e.g., upon application of power to such domains and disabling isolation cells only when such domains power crosses the threshold of voltage monitor allowing such domains to start functioning.

In some embodiments, isolation cell 412 may be implemented so that it is low when isolation cell 412 is enabled (e.g., as isolation cell 202). Thus, upon enabling of isolation cell 412, signal $POR'_{412}$ is low, thereby keeping circuit 634 in a reset mode (in a known static state), and, upon disabling of isolation cell 412, signal $POR'_{412}$ transitions from low to high and circuit 634 begins operating from a known state.

As illustrated in table 700, when circuit 634 corresponds to test controller 404, the pins or pads of IC 400 operate according to the functional mode ("F"), and test controller 404 is in reset mode (since signal $POR'_{412}$ reset test controller 404 during power-up, or each time isolation cell 412 is enabled.

As shown in table 700, in some embodiments, test controller 404 is kept in a reset state during functional mode. In some embodiments, keeping test controller 404 in a reset or known state during functional mode may advantageously prevent erratic behavior, which may arise by the interaction between test controller 404 and other functional circuits.

Test modes (e.g., ATPG mode, or any of the isolation test modes illustrated in table 700) may be entered after power-up. For example, test modes may be entered (e.g., after signal $POR_{rst}$ is deasserted) by programming one or more of the plurality of test bits (602, 604, 606, 608, 610, 612) of IC 400 (e.g., according to table 700).

During ATPG mode (as illustrated in table 700), test controller 404 is active and is forced enabled by test bit 608 (TESTBIT3) to avoid resetting the test controller when the test controller is executing the ATPG patterns. During ATPG mode, isolation cell 412 is controlled by signal ATPG_EN. During ATPG mode, the pins or pads of IC 400 may operate according to the patterns ("P").

During isolation test modes 1 to 8 (as illustrated in table 700), test bits 602 (TESTBIT0), 604 (TESTBIT1), 612 (TESTBIT5) are asserted (e.g., high), and test bit 610 is deasserted (e.g., low) so that signal $POR_{412}$ is controlled by test bit 606 (TESTBIT2), and isolation cell 412 is controlled by pin or pad 422.

In some embodiments, test bit 602 (TESTBIT0), when asserted (e.g., high), configures one or more pins or pads of IC 400 (e.g., 420, 422, 426, 432, 434, 436, 438, 440, 442) as test mode input/output pins or pads. For example, in some embodiments, when test bit 602 (TESTBIT0) is asserted, pins or pads 420 and 422 (e.g., including 422', 422", etc.) are configured as inputs, and pins or pads 426, 438 and 440 are configured as outputs.

As shown in FIG. 6, the output of isolation cell 412 may be observed, e.g., in pin or pads 438 and 440. Using pins or pads associated with the Run domain to observe outputs of isolation cell 412 advantageously allows for the observation of signal POR'$_{412}$ without going through an additional isolation cell (which may be required if the signal is to cross to another power domain, such as returning to the ULP domain).

Test bit 604 (TESTBIT1), when asserted (e.g., high), configures MUXes 614 and 616 to cause signal POR412 to be controlled by test bit 606 (TESTBIT 2).

Test bit 608 (TESTBIT3), when asserted (e.g., high), forces enable signal SEN$_{404}$ high to keep test controller 404 enabled.

Test bits 610 (TESTBIT4) and 612 (TESTBIT5) control the state of MUXes 620, and 618, respectively.

In some embodiments, test bits 602, 604, 606, 608, 610, 612 (TESTBIT0, TESTBIT1, TESTBIT2, TESTBIT3, TESTBIT4, TESTBIT5) are programmable via JTAG (or other digital interface). As shown in FIG. 6, in some embodiments, test bits 602, 604, 608, 610, and 612 (TESTBIT0, TESTBIT1, TESTBIT3, TESTBIT4, TESTBIT5) may be asynchronously reset to logic 0 when POR$_{rst}$ is asserted and can be also programmed to logic 1 or logic 0 (e.g., via JTAG).

In some embodiments, test bit 606 (TESTBIT2) may be asynchronously set (to logic 1) when POR$_{rst}$ is asserted (or when signal Sin420 is forced low when TESTBIT1 is equal to logic 1) and can be also programmed to logic 1 or logic 0 (e.g., via JTAG). In some embodiments, providing pin or pad 420 to asynchronously set TESTBIT 2 advantageously allows for brining test controller 404 (and, e.g., JTAG logic) out of reset. For example, in some embodiments, causing TESTBIT2 to be logic 0 (e.g., as in some isolation tests, as illustrated in FIG. 7) may cause the JTAG logic to be in reset mode, and thus pin or pad 420 may be used to set TESTBIT2 to logic 1 when JTAG logic is in reset mode.

The outputs of isolation tests 1 to 8 (columns 438, 440, and "TCU status" reflect the states of pins and pads 438 and 440, and test controller 404, respectively when the respective isolation test passes.

As illustrated in table 700, during isolation test 1, pin or pad 422 is set to 0 (e.g., by forcing 0 V on pin or pad 422) to enable isolation cell 412, and TESTBIT2 is set to 1 to set signal POR$_{412}$ to 1. If a 0 is measured in pin or pad 438 (e.g., if a low voltage, such as 0 V is measured in pin or pad 438), then isolation test 1 passed and there is no stuck at 1 fault in the path from the output of isolation cell 412 to pin or pad 438. If a 1 is measured in pin or pad 438 (e.g., if a high voltage, such as 1.0 V is measured in pin or pad 438), then isolation test 1 failed.

In some embodiments, isolation test 2 may be performed after isolation test 1 fails. As illustrated in table 700, during isolation test 2, one of the other pin or pad 422 (e.g., 422', 422", etc.) is set to 0 while the pin or pad 422 is set to 1, and TESTBIT2 is set to 1 to set signal POR$_{412}$ to 1. If a 0 is measured in pin or pad 438, then, isolation test 2 passed and the other pin or pad 422 (e.g., 422', 422", etc.) is controlling isolation cell 412. Isolation test 2 passing implies that isolation cell 412 is not missing but is indicative of a wrong isolation connection, since pin or pad 422 is not properly controlling isolation cell 412 (since isolation test 1 failed) and another pin or pad 422 (e.g., 422', 422", etc.) is controlling isolation cell 412. In some embodiments, if isolation test 1 fails, isolation test 2 is performed for each of the other pins or pads 422 (422', 422", etc.) to check if isolation cell 412 is wrongly connected (isolation test 2 passing), or missing (isolation test 2 failing). When both isolation test 1 or 2 fails it could be missing isolation or stuck-at 1 fault from pin or pad 422/other pins or pads 422 to isolation cell 412 (If stuck-at 1 fault exists between pin or pad 422/other pins or pads 422 to isolation cell 412 it is equivalent to missing isolation)

In some embodiments, isolation test 3 may be performed after confirming that isolation cell 412 is placed properly (e.g., after isolation tests 1 or 2 pass) or if isolation cell 412 is seen missing or stuck-at 1 fault exists between pin or pad 422/other pins or pads 422 to isolation cell 412 (e.g., when both isolation test 1 and 2 fail). As illustrated in table 700, during isolation test 3, isolation cell 412 is disabled, e.g., by setting pin or pad 422 to 1 (if isolation test 1 passed), setting one of the other pin or pad 422 (e.g., 422', 422", etc.) to 1 (if isolation test 2 passed). In some embodiments, all pins or pads 422 (e.g., 422, 422', 422", etc.) are set to 1 (if both isolation test 1 and isolation test 2 fail, then there is a missing isolation condition). During isolation test 3, TESTBIT2 is forced to 0 (e.g., using JTAG) to set signal POR$_{412}$ to 0. If a 0 is measured in pin or pad 438, then, there are no stuck-at 1 faults in the path from the output of test bit 606 (TESTBIT2) to pin or pad 438. If a 1 is measured in pin or pad 438, then isolation test 3 failed.

During isolation test 4, signal POR'412 is forced to 0 and TESTBIT3 is set to 0. If it is observed at pad 440 that test controller 404 is in reset mode (e.g., by observing a 0 in pin of par 440, then there is no stuck-at 1 fault from the output of buffer 624 to test controller 404. If test controller 404 is not in reset mode, the isolation test 4 failed.

As shown in table 700, isolation test 5 passes when isolation test 4 fails. Thus, isolation test 5 passing is indicative of a stuck-at 1 fault in the path from buffer 624 to test controller 404.

As shown in table 700, isolation test 6 passes when isolation test 3 fails. Thus, isolation test 6 passing is indicative of a stuck-at 1 fault in the path from TESTBIT 2 to isolation cell 412 if correct isolation cell (isolation test 1 passed) or wrong isolation cell (if isolation test 2 passed) and indicative of a stuck-at 1 fault in the path from TESTBIT 2 to pin or pad 438 if missing isolation (if both isolation test 1 and 2 failed).

As shown in table 700, during isolation test 7, isolation cell 412 is enabled, thus forcing signal POR'412 to 0 in a similar manner as in isolation tests 1 and 2. Thus, isolation test 7 passing is indicative of no stuck-at 1 faults between buffer 624 and test controller 404. Isolation test 7 failing is indicative of a stuck-at 1 fault between buffer 624 and test controller 404.

As shown in table 700, isolation test 8 passes when isolation test 7 fails. Thus, isolation test 8 passing is indicative of a stuck-at 1 fault in the path from buffer 624 to test controller 404.

As shown in FIGS. 6 and 7, the output of isolation cell 412 may be observed at different points of the path using pins or pads 438 and 440. In some embodiments, the output of isolation cell 412 may be observed, instead or in addition to using pins or pads, using non-volatile memory, such as flip-flops. For example, as shown in FIG. 6, in some embodiments, the output of circuit 634 may be observed using pin or pad 440, and, additionally, using test shift register 632. The output of AND gate 630 may also be accessible via test shift register 632. In some embodiments, test shift register 632 may be a scan chain, e.g., accessible via JTAG.

Although various isolation tests are illustrated in FIG. 7, additional tests are also possible. For example, in some embodiments, an isolation test may be performed to find the pin or pad (e.g., 426) muxed in isolation cell test mode corresponding to a FUNC_EN (e.g., to check whether pin or pad 422 muxed with FUNC_EN corresponding to ULP to RUN power domain crossing) or to check if there is a stuck-at 1 fault between pin or pad 422 and the enable input of isolation cell 412 (by observing pin or pad 426).

FIG. 8 shows a flow chart of embodiment method 800 for testing isolation cell 412, according to an embodiment of the present invention. FIG. 8 may be understood in view of FIGS. 6 and 7.

During step 802, isolation test 1 is performed. Isolation test 1 passing is indicative of isolation cell 412 being present and connected properly and no stuck-at 1 fault from pin or pad 422 to pin or pad 438. If isolation test 1 fails, isolation test 2 is performed during step 806. If isolation test 1 passes, isolation test 2 may be skipped. Isolation test 2 passing after isolation test 1 fails is indicative of isolation cell 412 being present but being wrongly connected (controlled by another pin or pad 422, such as 422' or 422", instead of pin or pad 422) and no stuck-at 1 fault from another pin or pad 422 to pin or pad 438. Both isolation tests 1 and 2 failing is indicative of isolation cell 412 not being present (missing) or stuck-at 1 fault from pin or pad 422 to pin or pad 438/another pin or pad 422 to pin or pad 438.

During step 812, isolation test 3 is performed. In some embodiments, setting up isolation test 3 may depend on the results of isolations 1 and 2. For example, if isolation test 3 is performed after step 804 (after isolation test 1 passes), then pin or pad 422 is set to 1 to disable isolation cell 412. If isolation test 3 is performed after step 808 (after isolation test 1 fails and isolation test 2 passes), then the pin or pad 422 that was found to be controlling isolation cell 412 (e.g., 422', 422", etc.) is set to 1 to disable isolation cell 412. If isolation test 3 is performed after step 810 (after isolation tests 1 and 2 fail), then the state of pins or pads 422, 422', 422", etc., is not relevant and the setting of pin or pad 422, 422', 422", etc., may be omitted.

Since during isolation test 3 TESTBIT2 is forced to 0 (e.g., through JTAG), and since isolation cell 412 is disabled or missing (and thus, not blocking the path from TESTBIT2 to pin or pad 438), if isolation test 3 fails (a 1 is read in pin or pad 438), then there is a stuck-at 1 fault in the path from TESTBIT2 to isolation cell 412 in case isolation test 1 or isolation test 2 passed earlier or there is a stuck-at 1 fault in the path from TESTBIT2 to pin or pad 438 if both isolation test 1 and isolation test 2 failed earlier. If isolation test 3 passes, then there is no stuck-at 1 fault in the path from TESTBIT2 to pin or pad 438.

During step 818, isolation test 4 is performed. During isolation test 4, signal POR'412 is forced to 0 (e.g., by having a similar setup as in isolation test 3) and TESTBIT3 is set to 0 to avoid masking signal $POR_{412}$ with OR gate 628. If isolation test 4 fails after isolation test 3 passes, a stuck-at 1 fault is detected in the path from the output of buffer 624 to circuit 634. If isolation test 4 passes (e.g., regardless of the status of isolation tests 1 and 2), then no stuck-at 1 faults are detected in the path from the output of buffer 624 to circuit 634.

As illustrated in FIG. 8, by combining different isolation tests, some embodiments are advantageously capable of detecting faults (e.g., missing isolation cell, wrong connection of an isolation cell, and/or stuck at faults, as well as the location of such faults. For example, in some embodiments:

isolation test 1 passing followed by isolation test 3 passing followed by isolation test 4 passing results in isolation cell 412 being present, connected properly, and without stuck at 1 faults in the signal path before or after isolation cell 412 and also without stuck-at 1 faults on the enable path of the isolation cell (from path pin or pad 422 to isolation cell 412);

isolation test 1 passing followed by isolation test 3 passing followed by isolation test 4 failing results in isolation cell 412 being present, connected properly, and with stuck at 1 faults in the signal coupled to the output of buffer 624 present in the fanout of isolation cell 412;

isolation test 1 passing followed by isolation test 3 failing results in isolation cell 412 being present, connected properly, and with stuck at 1 faults in the signal path coupled to the input of isolation cell 412;

isolation test 1 passing followed by isolation test 3 failing followed by isolation test 4 passing results in isolation cell 412 being present, connected properly, and with stuck at 1 faults in the signal path coupled to the input of isolation cell 412 and without stuck-at 1 faults in the signal coupled to the output of isolation cell 412;

isolation test 1 passing followed by isolation test 3 failing followed by isolation test 4 failing results in isolation cell 412 being present, connected properly, and with stuck at 1 faults in the signal path before isolation cell 412 and after buffer 624 present in the fanout of isolation cell 412;

isolation test 1 failing followed by isolation test 2 passing followed by isolation test 3 passing followed by isolation test 4 passing results in isolation cell 412 being present, wrongly connected, and without stuck at 1 faults in the signal path before or after isolation cell 412 and also without stuck-at 1 faults on the enable path of the isolation cell (from path another pin or pad 422 to isolation cell 412);

isolation test 1 failing followed by isolation test 2 passing followed by isolation test 3 passing followed by isolation test 4 failing results in isolation cell 412 being present, wrongly connected, and with stuck at 1 faults in the signal coupled to the output of buffer 624 present in the fanout of isolation cell 412;

isolation test 1 failing followed by isolation test 2 passing followed by isolation test 3 failing results in isolation cell 412 being present, wrongly connected, and with stuck at 1 faults in the signal path coupled to the input of isolation cell 412;

isolation test 1 failing followed by isolation test 2 passing followed by isolation test 3 failing followed by isolation test 4 passing results in isolation cell 412 being present, wrongly connected, and with stuck at 1 faults in the signal path coupled to the input of isolation cell 412 and without stuck-at 1 faults in the signal coupled to the output of isolation cell 412;

isolation test 1 failing followed by isolation test 2 passing followed by isolation test 3 failing followed by isolation test 4 failing results in isolation cell 412 being present, wrongly connected properly, and with stuck at 1 faults in the signal path before isolation cell 412 and after buffer 624 present in the fanout of isolation cell 412;

isolation test 1 failing followed by isolation test 2 failing followed by isolation test 3 passing followed by isolation test 4 passing results in missing isolation cell 412 or stuck-at 1 fault exists on path from pin or pad 422/other pin or pad 422 to isolation cell 412 and without stuck at 1 faults in the signal path from test bit 606 to circuit 634;

isolation test 1 failing followed by isolation test 2 failing followed by isolation test 3 passing followed by isolation test 4 failing results in missing isolation cell 412 or stuck-at 1 fault exists on path from pin or pad 422/other pin or pad 422 to isolation cell 412, and with stuck at 1 faults in the signal path between buffer 624 and circuit 634;

isolation test 1 failing followed by isolation test 2 failing followed by isolation test 3 failing results in missing isolation cell 412 or stuck-at 1 fault exists on path from pin or pad 422/other pin or pad 422 to isolation cell 412, and with stuck at 1 faults in the signal path between test bit 606 and pin or pad 438;

isolation test 1 failing followed by isolation test 2 failing followed by isolation test 3 failing followed by isolation test 4 failing results in missing isolation cell 412 or stuck-at 1 fault exists on path from pin or pad 422/other pin or pad 422 to isolation cell 412, and with stuck-at 1 faults in the signal path between test bit 606 and pin or pad 438 and between buffer 624 and circuit 634.

As illustrated in FIGS. 6-8, the combination of one or more of isolation tests 1-8 advantageously allows for detecting missing isolation cells, wrongly connected isolation cells, and the location of stuck-at 1 faults in the path before or after an isolation cell and on the enable path of isolation cell.

In some embodiments, the test coverage obtained by one or more of isolation tests 1-8 is greater than conventional test methods that rely solely on ATPG patterns. For example, when circuit 634 corresponds to test controller 404, ATPG patterns may not detect stuck-at 1 faults in the path from OR gate 628 to test controller 404 (since signal $SEN_{404}$ is forced high by TESTBIT3 to prevent test controller 404 from resetting during the running of the ATPG patterns). In some embodiments, such coverage is achieved, e.g., by performing isolation test 4.

In some embodiments, being able to detect stuck-at 1 faults after the isolation cell 412 may prevent issues in the field. For example, in some embodiments, such as when circuit 634 corresponds to test controller 404, the second input of AND gate 630 may correspond to a JTAG reset pin. The JTAG reset pin may be forced to 0 during performance of, e.g., functional tests, such as for entry/exit of low power and standby by modes to keep test controller 404 in reset mode. If an undetected stuck-at 1 fault remains in the path from OR gate 628 to test controller 404, pulling up the JTAG reset pin in the filed may cause the test controller to exit reset mode during functional mode, which may cause malfunctions. Performed isolation test 4, for example, may advantageously detect such stuck-at 1 faults.

In some embodiments, signal $POR_{rst}$ may correspond to the power-ok signal of a oscillators, PLL, NVM or OTP. In some such embodiments, signal $POR_{rst}$ may be forced high(deasserted) during testing since the oscillators, PLL, NVM, OTP may be operational during testing. In some embodiments, test circuit 600 advantageously allows for detecting stuck-at 1 faults in power-ok signals (which may prevent one or more circuits from resetting upon exiting standby/low power mode), which may advantageously prevent issues in the field.

In some embodiments, test circuit 600 advantageously allows for the determination of the location of a stuck-at 1 (e.g., before the isolation cell, or after the isolation cell and also on the enable pin of the isolation cell), which may advantageously allow an IC designer to address weaknesses in the layout of the IC based on the location of the more frequent stuck-at 1 faults detected.

In some embodiments, test circuit 600 is advantageously capable of detecting missing or wrongly connected isolation cells during IC testing. Such coverage may be unavailable with ATPG patterns alone.

In some embodiments, test circuit 600 and associated isolation tests (e.g., illustrated in FIGS. 7 and 8) may be advantageously used and performed, respectively, when test controller 404 is in reset mode (or disabled).

In some embodiments, one or more isolation tests (e.g., as shown in FIGS. 7 and 8) may be performed by a conventional automated test equipment (ATE). In some embodiments, the ATE may report (e.g., using a log file, a signal, an image on a screen coupled to the ATE, a digital flag, or through any other conventional mechanism) the result of each of the isolation tests (e.g., whether a particular isolation test passed or failed), whether a particular isolation cell is present and connected correctly, present but connected incorrectly, or missing, whether a stuck-at 1 fault is detected, and/or the location of a detected stuck-at 1 fault.

In some embodiments, test circuit 600 may advantageously aid in detecting missing or wrongly connected isolation cells during IC design and simulation phase. For example, in some embodiments, circuit design software tools (e.g., running in a computer having a processor coupled to a memory) may be used to incorporate test circuit 403 into the IC design, may cause one or more embodiments of isolation tests (e.g., as shown in FIGS. 7 and 8) to be run during circuit simulation, and may produce an indication of whether an isolation cell is present, missing or wrongly connected.

Although FIGS. 6-8 are illustrative of a circuit and method of testing an isolation cell (e.g., 412) from a powered domain (e.g., ULP) to an unpowered domain (e.g., Run), it is understood that a similar circuit and method may be used to test an isolation cell from an unpowered domain to a powered domain (e.g., such as isolation cells 406, 408, 410).

Figure 9:
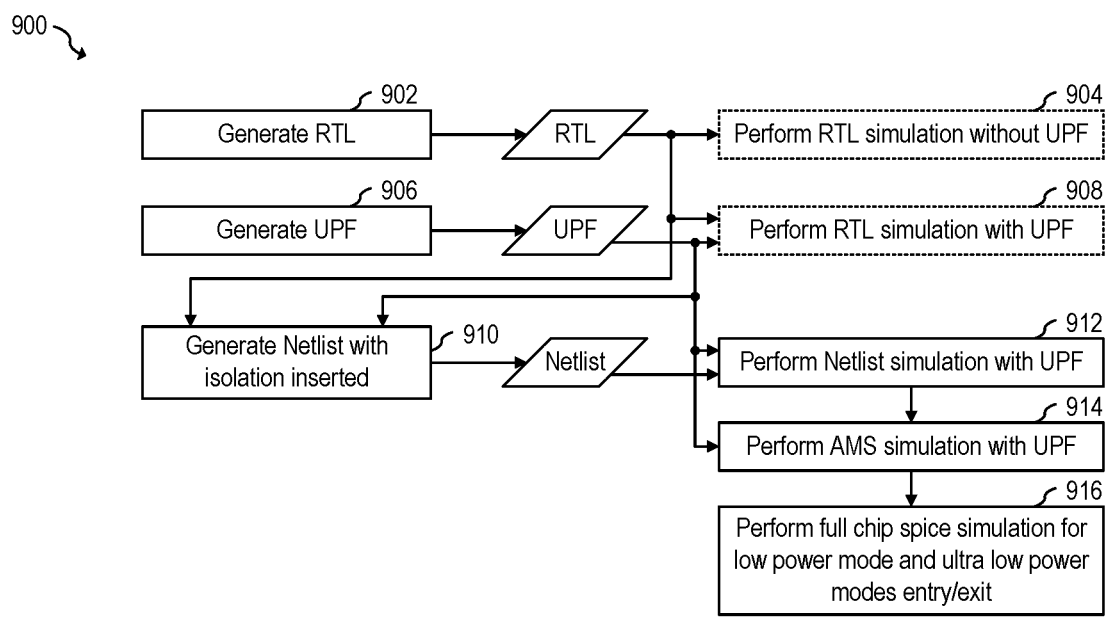
FIG. 9 shows an isolation insertion and simulation flow, according to an embodiment of the present invention.

FIG. 9 shows isolation insertion and simulation flow 900, according to an embodiment of the present invention. In some embodiments, method 900 may be performed, e.g., using a conventional computer and using conventional circuit design software tools, such as tools from Synopsys, Cadence, and Mentor Graphics.

During step 902, register-transfer level code (RTL) is generated. RTL may be generated, e.g., using Verilog or VHDL, for example. In an embodiment, the isolation cell enable (e.g., $iso\_en_{412}$) and test logic (e.g., elements 602, 604, 606, 608, 610, 612, 614, 616, 618, 620) are added in RTL without adding the isolation cell (e.g., 412).

During step 904, digital simulations, such as RTL simulations and/or gate level simulations (GLS), may be performed without information from a unified power format (UPF) file. A UPF file generally includes information about power states and supply nets of the different power domains of the IC. Since there is no power information on the different power domains, and since general the circuits are initialized at power-up during digital simulations, digital simulations may pass even if with missing isolations.

During step 906, the UPF file is generated. In the UPF file, the name of the signal to isolation cell is to be inserted is provided (e.g., $POR_{rst}$).

During step 908, digital simulations (e.g., RTL) may be performed with information from the UPF file.

During step 910, a netlist is generated based on the RTL code using a synthesis tool. The netlist includes the desired isolation cells, which are automatically inserted by the synthesis tool based on the RTL and UPF.

During step 912, netlist simulations (e.g., GLS) are performed with information from the UPF file.

During step 914, analog and mixed signal simulations are performed with information from the UPF file. During step

616, a full chip spice simulation is performed for low power mode and ultra low power mode entry and exit.

UPF-based digital simulations (e.g., during steps 908, 912, and 914) force signals from unpowered domains to an uncertain state "X." Thus, UPF-based simulations fail when there is a missing isolation cell from an unpowered domain to a powered domain, or if the isolation cell is connected incorrectly (e.g., controlled by the wrong signal). Thus, UPF-based simulations may also fail when there is a missing isolation cell on an critical signal like POR from powered to unpowered domain as the isolation may reset the unpowered domain when it powers up again (low power exit/standby exit) or if the isolation cell is connected incorrectly (e.g., controlled by the wrong signal). However, generally, no additional information is provided by the simulation, and manual debug may be needed to determine the cause of the failing simulation (e.g., to determine which isolation cell is missing or connected incorrectly).

In some embodiments, simulating one or more of isolation tests 1-8 during steps 912, 914, and/or 916 may advantageously result in the detection of missing or wrongly connected isolation cell, as well as in the identification of the missing or wrongly connected isolation cell.

Advantages of some embodiments include the ability to rely on the synthesis tool to automatically add isolation cells to the IC design while ensuring that isolation cells are present and properly connected. In some embodiments, verifying that isolation cells are present and properly connected, and the identification of missing or wrongly connected isolation cells is advantageously faster using, e.g., one or more of isolation test 1-8 than by performing manual debug.

Additional advantages of some embodiments include that, by relying on automatic placement of isolation cells, human error associated with manual placement of isolation cells (e.g., in RTL) may be avoided.

Although FIGS. 6-9 have been described with respect to an isolation cell that provides isolation from the ULP domain to the Run domain, a similar implementation (circuit and test modes) may be implemented with respect to isolation cells that provide isolation from ULP domain to LP domain, from Run domain to LP domain, from Run domain to ULP domain, from LP domain to Run domain, and from LP domain to ULP domain.

In some embodiments, the synthesis tool may reroute the path of a signal (e.g., $POR_{rst}$) for optimization purposes. For example, in some embodiments, the synthesis tool may reroute signal $POR_{rst}$ via the LP domain rather than directly to the Run domain. In such case, isolation cells may not be placed by the synthesis tool in the domain crossing between ULP domain to LP domain and in the domain crossing between LP domain and Run domain. Such missing isolation cells may not be reported during simulation (e.g., during steps 904, 912, 914 or 916) since the signal is crossing from a powered domain to an unpowered domain.

Figure 10:
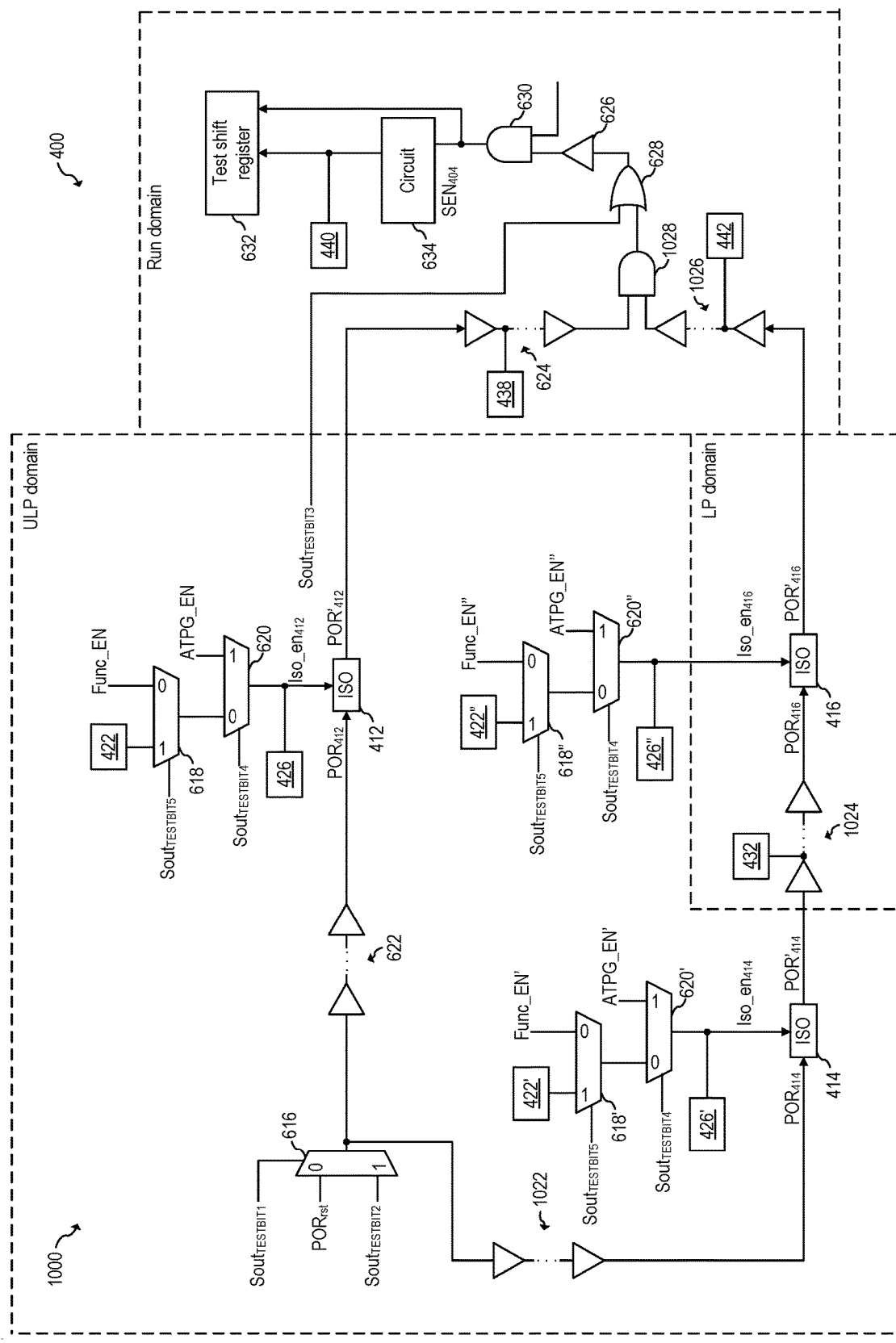
FIG. 10 shows a schematic diagram of a test circuit, according to an embodiment of the present invention.

In some embodiments, redundant signal paths (e.g., covering all possible domain crossings) are specified during RTL and UPF. By specifying redundant path, even if the synthesis tool reroutes the signal, such rerouted signal would have a specified isolation cell. For example, FIG. 10 shows a schematic diagram of test circuit 1000, according to an embodiment of the present invention. Test circuit 403 may be implemented as test circuit 1000. Test circuit 1000 operates in a similar manner as test circuit 600. Test circuit 1000, however, includes additional MUXes 618' and 620' for testing isolation cell 414, additional MUXes 618" and 620" for testing isolation cell 416, and AND gate 1028.

In some embodiments, MUXes 618', 618", 620', 620" as well as signals $Iso\_en_{414}$ and $Iso\_en_{416}$ are specified in RTL (e.g., during step 902), e.g., to allow for the synthesis tool to automatically insert (e.g., during step 910) the isolation cells (e.g., 414, 416).

Isolation cells 414 and 416 may be tested in a similar manner as shown with respect to isolation cell 412 in FIGS. 6-8.

As can be seen in FIG. 10, signal $POR_{rst}$ may reach OR gate 628 via the signal path crossing from the ULP domain into the Run domain using isolation 412 or via the signal path crossing from the ULP domain into the LP domain using isolation cell 414, and then crossing from the LP domain into the Run domain using isolation cell 416.

If the synthesis tool (e.g., during step 910) optimizes the design by routing signal $POR_{rst}$ via isolation cell 412, the synthesis tool may omit implementing the path going through isolation cells 414 and 416, and the associated circuits (e.g., 618', 618", 620', 620") as well as AND gate 1028. In such scenario, test circuit 1000 may become identical to test circuit 600.

If the synthesis tool (e.g., during step 910) optimizes the design by routing signal $POR_{rst}$ via isolation cells 414 and 416, the synthesis tool may omit implementing the path going through isolation cell 412 and the associated circuits (e.g., 618, 620) as well as AND gate 1028. In such scenario, isolation cells 414 and 416 are automatically inserted by the synthesis tool based on the RTL and UPF file (e.g., during step 910) and such isolation cells may be tested, e.g., in a similar manner as described with respect to isolation cell 412.

If both paths are implemented by the synthesis tool, test circuit 1000 may be implemented as shown in FIG. 10 and IC 400 may operate properly since the redundant paths are anded by AND gate 1028. In such case, testing of isolation cells 412, 414 and 416 may be performed in a similar manner as described with respect to isolation cell 412 in FIGS. 6-8. For example, testing of isolation cell 412 may be performed in a similar manner as described with respect to FIGS. 6-8 while checking on pin or pad 438 (isolation tests 1,2,3). Combined Testing of isolation cell 414 and isolation cell 416 may be performed in a similar manner as described with respect to isolation cell 412 in FIGS. 6-8 while checking on pin or pad 432 and pin or pad 442 respectively (isolation tests 1,2,3). Then, isolation test 4 may be performed by forcing TESTBIT3 to 'o' and observing the output on pin or pad 440.

Advantages of some embodiments include that, by adding redundancy in critical path that can benefit from isolation, some embodiments advantageously allow the synthesis tool to perform circuit optimizations without missing isolation cells on critical paths to unpowered domains.

Additional advantages of some embodiments include the capability of performing tests using standalone test modes during digital simulation to detect missing or wrongly connected isolation cell on critical paths for signals such as enable signals, reset signals, and power-ok signals. In some embodiments, the standalone test modes advantageously allow for testing buffers in the path of an isolation cell (e.g., for stuck-at 1 faults) during times in which coverage from functional patterns is not available, such as during characterization at cold temperatures (e.g., −30° C.) as testing at cold may be performed in EWS (Electronic Wafer Sort) where the external SMPS components may not be available.

Example embodiments of the present invention are summarized here. Other embodiments can also be understood from the entirety of the specification and the claims filed herein.

Example 1. An electronic circuit including: a first power domain including: a first isolation cell including a signal input, a signal output, and a control input, where the first isolation cell is configured to be enabled or disabled based on the control input of the first isolation cell, a first selection circuit having a first input configured to receive a first functional signal, a second input configured to receive a first test signal, and an output coupled to the control input of the first isolation cell, and a second selection circuit having a first input configured to receive a second functional signal, a second input configured to receive a second test signal, and an output coupled to the signal input of the first isolation cell; a second power domain including: a first circuit having an input coupled to the signal output of the first isolation cell, a first observation element coupled to a first intermediate node that is coupled between the signal output of the first isolation cell and the input of the first circuit, and a second observation element coupled to an output of the first circuit; where the electronic circuit includes a plurality of functional modes, and a first test mode; where, for each of the plurality of functional modes, the first power domain is configured to be on when the second power domain is on, and the second power domain is configured to be off in at least one functional mode in which the first power domain is configured to be on; where, when the electronic circuit is in the first test mode, the first selection circuit is configured to provide the first test signal to the control input of the first isolation cell, and the second selection circuit is configured to provide the second test signal to the signal input of the first isolation cell; and where, when the electronic circuit is in any of the plurality of functional modes, the first selection circuit is configured to provide the first functional signal to the control input of the first isolation cell, and the second selection circuit is configured to provide the second functional signal to the signal input of the first isolation cell.

Example 2. The electronic circuit of example 1, where the second power domain further includes an OR gate having a first input coupled to the signal output of the first isolation cell and to the first observation element, a second input configured to receive a third test signal from the first power domain, and an output coupled to the input of the first circuit, where, when the electronic circuit is in any of the plurality of functional modes, the third test signal is configured to be low.

Example 3. The electronic circuit of one of examples 1 or 2, where the third test signal is configured to cross from the first power domain to the second power domain without going through an isolation cell.

Example 4. The electronic circuit of one of examples 1 to 3, where the second power domain further includes an AND gate having a first input coupled to the signal output of the first isolation cell and to the first observation element, a second input configured to receive a third test signal, and an output coupled to the input of the first circuit, where, when the electronic circuit is in any of the plurality of functional modes, the third test signal is configured to be high.

Example 5. The electronic circuit of one of examples 1 to 4, where the first selection circuit includes a third input configured to receive a third test signal, where the electronic circuit includes a second test mode, and where, when the electronic circuit is in the second test mode, the first selection circuit is configured to provide the third test signal to the control input of the first isolation cell.

Example 6. The electronic circuit of one of examples 1 to 5, where the first selection circuit includes: a first multiplexer having a first input coupled to the first input of the first selection circuit, and a second input coupled to the second input of the first selection circuit; and a second multiplexer having a first input coupled to an output of the first multiplexer, a second input coupled to the third input of the first multiplexer, and an output coupled to the output of the first selection circuit.

Example 7. The electronic circuit of one of examples 1 to 6, where the first circuit includes a test controller configured to control the third test signal when the electronic circuit is in the second test mode.

Example 8. The electronic circuit of one of examples 1 to 7, where the second selection circuit includes a multiplexer having a first input coupled to the first input of the second selection circuit, a second input coupled to the second input of the second selection circuit, and an output coupled to the output of the second selection circuit.

Example 9. The electronic circuit of one of examples 1 to 8, where the first power domain further includes a third selection circuit having a first input configured to receive the second functional signal, a second input configured to receive a third test signal, and an output configured to control the second test signal, where, when the electronic circuit is in any of the plurality of functional modes, the third selection circuit is configured to provide the second functional signal to the second input of the second selection circuit.

Example 10. The electronic circuit of one of examples 1 to 9, where the first power domain further includes: a first test bit configured to control the first selection circuit; a second test bit configured to control the second selection circuit; and a third test bit configured to provide the second test signal.

Example 11. The electronic circuit of one of examples 1 to 10, where the first, second, and third test bits are programmable via joint test action group (JTAG) interface.

Example 12. The electronic circuit of one of examples 1 to 11, further including a plurality of pins or pads, where the first and second observation elements are first and second pins or pads of the plurality of pins or pads, respectively.

Example 13. The electronic circuit of one of examples 1 to 12, where the first power domain includes a third pin or pad, where, when the electronic circuit is in the first test mode, the third pin or pad is configured to control the second test signal.

Example 14. The electronic circuit of one of examples 1 to 13, where the first isolation cell includes an AND gate having a first input coupled to the signal input of the first isolation cell, a second input coupled to the control input of the first isolation cell, and an output coupled to the signal output of the first isolation cell.

Example 15. The electronic circuit of one of examples 1 to 14, where the first power domain includes a power-on-reset (POR) circuit configured to generate the second functional signal.

Example 16. The electronic circuit of one of examples 1 to 15, further including a third power domain including a second isolation cell, where, for each of the functional modes, the first power domain is configured to be on when the third power domain is on, the third power domain is configured to be off in at least one functional mode in which the first power domain is configured to be on, the third power domain is configured to be on when the second power domain is on, and the second power domain is configured to be off in at least one functional mode in which the third power domain is configured to be on; where the second power domain includes an AND gate having a first input coupled to the signal output of the first isolation cell, a second input coupled to a signal output of the second isolation cell, and an output coupled to an input of the first circuit; and where the first power domain includes: a third isolation cell having a signal input coupled to the output of the second selection circuit, and a signal output coupled to a signal input of the second isolation cell, a third selection circuit having a first input configured to receive a third functional signal, a second input configured to receive an third test signal, and an output coupled to a control input of the third isolation cell, and a fourth selection circuit having a first input configured to receive a fourth functional signal, a second input configured to receive an fourth test signal, and an output coupled to a control input of the second isolation cell.

Example 17. An integrated circuit including: a first power domain including: a power-on-reset (POR) circuit configured to generate a POR signal, where the POR circuit is configured to assert the POR signal when a first supply voltage of the first power domain reaches a predetermined threshold; a first isolation cell including a signal input, a signal output, and a control input, where the first isolation cell is configured to be enabled or disabled based on the control input of the first isolation cell, a first selection circuit having a first input configured to receive a first functional signal, a second input configured to receive a first test signal, and an output coupled to the control input of the first isolation cell, and a second selection circuit having a first input configured to receive the POR signal, a second input configured to receive a second test signal, and an output coupled to the signal input of the first isolation cell; a second power domain including: a test controller having an input coupled to the signal output of the first isolation cell, a first pin or pad coupled to a first intermediate node that is coupled between the signal output of the first isolation cell and the input of the test controller, and a second pin or pad coupled to an output of the test controller; where the integrated circuit includes a plurality of functional modes, and a first test mode; where, for each of the plurality of functional modes, the first power domain is configured to be on when the second power domain is on, and the second power domain is configured to be off in at least one functional mode in which the first power domain is configured to be on; where, when the integrated circuit is in the first test mode, the first selection circuit is configured to provide the first test signal to the control input of the first isolation cell, and the second selection circuit is configured to provide the second test signal to the signal input of the first isolation cell; and where, when the integrated circuit is in any of the plurality of functional modes, the first selection circuit is configured to provide the first functional signal to the control input of the first isolation cell, and the second selection circuit is configured to provide the POR signal to the signal input of the first isolation cell.

Example 18. The integrated circuit of example 17, where the second power domain further includes an OR gate having a first input coupled to the signal output of the first isolation cell and to the first pin or pad, a second input configured to receive a third test signal, and an output coupled to the input of the test controller, where, when the integrated circuit is in any of the plurality of functional modes, the third test signal is configured to be low.

Example 19. The integrated circuit of one of examples 17 or 18, where the first power domain further includes: a first test bit configured to control the first selection circuit; a second test bit configured to control the second selection circuit; a third test bit configured to provide the second test signal; and a fourth test bit configured to provide the third test signal to the second input of the OR gate without going through an isolation cell.

Example 20. The integrated circuit of one of examples 17 to 19, where the first power domain is an always-on power domain.

Example 21. The integrated circuit of one of examples 17 to 20, where the POR circuit is the only POR circuit of the integrated circuit.

Example 22. A method for testing an integrated circuit having a plurality of power domains, a plurality of functional modes, and a first test mode, the method including, during the first test mode: causing a first selection circuit having a first input for receiving a first functional signal, a second input for receiving a first test signal, and an output coupled to a control input of a first isolation cell, to deliver the first test signal to the control input of the first isolation cell; causing a second selection circuit having a first input for receiving a second functional signal, a second input for receiving a second test signal, and an output coupled to a signal input of the first isolation cell, to deliver the second test signal to the signal input of the first isolation cell, where a first power domain of the plurality of power domains includes the first and second selection circuits and the first isolation cell; setting the second test signal to logic 1; asserting the first test signal to enable the first isolation cell; after setting the second test signal to logic 1 and asserting the first test signal, measuring a first voltage at a first pin or pad coupled to a signal output of the first isolation cell, where a second power domain of the plurality of power domains includes the first pin or pad, where, for each of the plurality of functional modes, the first power domain is on when the second power domain is on, and the second power domain is off in at least one functional mode in which the first power domain is on; setting the second test signal to logic 0; deasserting the first test signal to disable the first isolation cell; after setting the second test signal to logic 0 and deasserting the first test signal, measuring a second voltage at the first pin or pad; setting a first test bit of the first power domain to logic 0, where the first test bit is coupled to a first input of an OR gate, the OR gate having a second input coupled to the signal output of the first isolation cell and to the first pin or pad, and an output coupled to an input of a test controller, where the second power domain includes the OR gate and the test controller; after setting the second test signal to logic 0, deasserting the first test signal, and setting the first test bit to logic 0, measure a third voltage at a second pin or pad coupled to an output of the test controller, where the second power domain includes the second pin or pad; when the first voltage corresponds to logic 0, the second voltage correspond to logic 0, and the third voltage is indicative of the test controller being in reset mode, generating a first indication that a first path coupled to the signal input of the first isolation cell does not have stuck-at 1 faults, and that a second path coupled to the signal output of the first isolation cell does not have stuck-at 1 faults; when the first voltage corresponds to logic 0 and the second voltage correspond to logic 1, generating a second indication that the first path has a stuck-at 1 fault; and when the first voltage corresponds to logic 0, the second voltage correspond to logic 0, and the third voltage is indicative of the test controller not being in reset mode, generating a third indication that the second path has a stuck-at 1 fault.

Example 23. The method of example 22, further including, during the first test mode: when the first voltage corresponds to logic 1; asserting a third test signal to enable a second isolation cell; after asserting the third test signal and setting the second test signal to logic 1, measuring a fourth voltage at the first pin or pad; and when the fourth voltage corresponds to logic 0, generating an indication that the first isolation cell is connected incorrectly.

Example 24. The method of one of examples 22 or 23, where generating the first, second, or third indications includes generating a log file with an automated test equipment (ATE).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electronic circuit comprising:
   a first power domain comprising:
      a first isolation cell comprising a signal input, a signal output, and a control input, wherein the first isolation cell is configured to be enabled or disabled based on the control input of the first isolation cell,
      a first selection circuit having a first input configured to receive a first functional signal, a second input configured to receive a first test signal, and an output coupled to the control input of the first isolation cell, and
      a second selection circuit having a first input configured to receive a second functional signal, a second input configured to receive a second test signal, and an output coupled to the signal input of the first isolation cell;
   a second power domain comprising:
      a first circuit having an input coupled to the signal output of the first isolation cell,
      a first observation element coupled to a first intermediate node that is coupled between the signal output of the first isolation cell and the input of the first circuit, and
      a second observation element coupled to an output of the first circuit;
   wherein the electronic circuit comprises a plurality of functional modes, and a first test mode;
   wherein, for each of the plurality of functional modes, the first power domain is configured to be on when the second power domain is on, and the second power domain is configured to be off in at least one functional mode in which the first power domain is configured to be on;
   wherein, when the electronic circuit is in the first test mode, the first selection circuit is configured to provide the first test signal to the control input of the first isolation cell, and the second selection circuit is configured to provide the second test signal to the signal input of the first isolation cell; and
   wherein, when the electronic circuit is in any of the plurality of functional modes, the first selection circuit is configured to provide the first functional signal to the control input of the first isolation cell, and the second selection circuit is configured to provide the second functional signal to the signal input of the first isolation cell.

2. The electronic circuit of claim 1, wherein the second power domain further comprises an OR gate having a first input coupled to the signal output of the first isolation cell and to the first observation element, a second input configured to receive a third test signal from the first power domain, and an output coupled to the input of the first circuit, wherein, when the electronic circuit is in any of the plurality of functional modes, the third test signal is configured to be low.

3. The electronic circuit of claim 2, wherein the third test signal is configured to cross from the first power domain to the second power domain without going through an isolation cell.

4. The electronic circuit of claim 1, wherein the second power domain further comprises an AND gate having a first input coupled to the signal output of the first isolation cell and to the first observation element, a second input configured to receive a third test signal, and an output coupled to the input of the first circuit, wherein, when the electronic circuit is in any of the plurality of functional modes, the third test signal is configured to be high.

5. The electronic circuit of claim 1, wherein the first selection circuit comprises a third input configured to receive a third test signal, wherein the electronic circuit comprises a second test mode, and wherein, when the electronic circuit is in the second test mode, the first selection circuit is configured to provide the third test signal to the control input of the first isolation cell.

6. The electronic circuit of claim 5, wherein the first selection circuit comprises:
   a first multiplexer having a first input coupled to the first input of the first selection circuit, and a second input coupled to the second input of the first selection circuit; and
   a second multiplexer having a first input coupled to an output of the first multiplexer, a second input coupled to the third input of the first multiplexer, and an output coupled to the output of the first selection circuit.

7. The electronic circuit of claim 5, wherein the first circuit comprises a test controller configured to control the third test signal when the electronic circuit is in the second test mode.

8. The electronic circuit of claim 1, wherein the second selection circuit comprises a multiplexer having a first input coupled to the first input of the second selection circuit, a second input coupled to the second input of the second selection circuit, and an output coupled to the output of the second selection circuit.

9. The electronic circuit of claim 1, wherein the first power domain further comprises a third selection circuit having a first input configured to receive the second functional signal, a second input configured to receive a third test signal, and an output configured to control the second test signal, wherein, when the electronic circuit is in any of the plurality of functional modes, the third selection circuit is configured to provide the second functional signal to the second input of the second selection circuit.

10. The electronic circuit of claim 1, wherein the first power domain further comprises:
    a first test bit configured to control the first selection circuit;
    a second test bit configured to control the second selection circuit; and
    a third test bit configured to provide the second test signal.

11. The electronic circuit of claim 10, wherein the first, second, and third test bits are programmable via joint test action group (JTAG) interface.

12. The electronic circuit of claim 1, further comprising a plurality of pins or pads, wherein the first and second observation elements are first and second pins or pads of the plurality of pins or pads, respectively.

13. The electronic circuit of claim 12, wherein the first power domain comprises a third pin or pad, wherein, when the electronic circuit is in the first test mode, the third pin or pad is configured to control the second test signal.

14. The electronic circuit of claim 1, wherein the first isolation cell comprises an AND gate having a first input coupled to the signal input of the first isolation cell, a second input coupled to the control input of the first isolation cell, and an output coupled to the signal output of the first isolation cell.

15. The electronic circuit of claim 1, wherein the first power domain comprises a power-on-reset (POR) circuit configured to generate the second functional signal.

16. The electronic circuit of claim 1, further comprising a third power domain comprising a second isolation cell, wherein, for each of the functional modes, the first power domain is configured to be on when the third power domain is on, the third power domain is configured to be off in at least one functional mode in which the first power domain is configured to be on, the third power domain is configured to be on when the second power domain is on, and the second power domain is configured to be off in at least one functional mode in which the third power domain is configured to be on;
- wherein the second power domain comprises an AND gate having a first input coupled to the signal output of the first isolation cell, a second input coupled to a signal output of the second isolation cell, and an output coupled to an input of the first circuit; and
- wherein the first power domain comprises:
  - a third isolation cell having a signal input coupled to the output of the second selection circuit, and a signal output coupled to a signal input of the second isolation cell,
  - a third selection circuit having a first input configured to receive a third functional signal, a second input configured to receive a third test signal, and an output coupled to a control input of the third isolation cell, and
  - a fourth selection circuit having a first input configured to receive a fourth functional signal, a second input configured to receive a fourth test signal, and an output coupled to a control input of the second isolation cell.

17. An integrated circuit comprising:
a first power domain comprising:
- a power-on-reset (POR) circuit configured to generate a POR signal, wherein the POR circuit is configured to assert the POR signal when a first supply voltage of the first power domain reaches a predetermined threshold;
- a first isolation cell comprising a signal input, a signal output, and a control input, wherein the first isolation cell is configured to be enabled or disabled based on the control input of the first isolation cell,
- a first selection circuit having a first input configured to receive a first functional signal, a second input configured to receive a first test signal, and an output coupled to the control input of the first isolation cell, and
- a second selection circuit having a first input configured to receive the POR signal, a second input configured to receive a second test signal, and an output coupled to the signal input of the first isolation cell;
a second power domain comprising:
- a test controller having an input coupled to the signal output of the first isolation cell,
- a first pin or pad coupled to a first intermediate node that is coupled between the signal output of the first isolation cell and the input of the test controller, and
- a second pin or pad coupled to an output of the test controller;

wherein the integrated circuit comprises a plurality of functional modes, and a first test mode;
wherein, for each of the plurality of functional modes, the first power domain is configured to be on when the second power domain is on, and the second power domain is configured to be off in at least one functional mode in which the first power domain is configured to be on;
wherein, when the integrated circuit is in the first test mode, the first selection circuit is configured to provide the first test signal to the control input of the first isolation cell, and the second selection circuit is configured to provide the second test signal to the signal input of the first isolation cell; and
wherein, when the integrated circuit is in any of the plurality of functional modes, the first selection circuit is configured to provide the first functional signal to the control input of the first isolation cell, and the second selection circuit is configured to provide the POR signal to the signal input of the first isolation cell.

18. The integrated circuit of claim 17, wherein the second power domain further comprises an OR gate having a first input coupled to the signal output of the first isolation cell and to the first pin or pad, a second input configured to receive a third test signal, and an output coupled to the input of the test controller, wherein, when the integrated circuit is in any of the plurality of functional modes, the third test signal is configured to be low.

19. The integrated circuit of claim 18, wherein the first power domain further comprises:
- a first test bit configured to control the first selection circuit;
- a second test bit configured to control the second selection circuit;
- a third test bit configured to provide the second test signal; and
- a fourth test bit configured to provide the third test signal to the second input of the OR gate without going through an isolation cell.

20. The integrated circuit of claim 17, wherein the first power domain is an always-on power domain.

21. The integrated circuit of claim 17, wherein the POR circuit is the only POR circuit of the integrated circuit.

22. A method for testing an integrated circuit having a plurality of power domains, a plurality of functional modes, and a first test mode, the method comprising, during the first test mode:
- causing a first selection circuit having a first input for receiving a first functional signal, a second input for receiving a first test signal, and an output coupled to a control input of a first isolation cell, to deliver the first test signal to the control input of the first isolation cell;
- causing a second selection circuit having a first input for receiving a second functional signal, a second input for receiving a second test signal, and an output coupled to a signal input of the first isolation cell, to deliver the second test signal to the signal input of the first isolation cell, wherein a first power domain of the plurality of power domains comprises the first and second selection circuits and the first isolation cell;

setting the second test signal to logic 1;

asserting the first test signal to enable the first isolation cell;

after setting the second test signal to logic 1 and asserting the first test signal, measuring a first voltage at a first pin or pad coupled to a signal output of the first isolation cell, wherein a second power domain of the plurality of power domains comprises the first pin or pad, wherein, for each of the plurality of functional modes, the first power domain is on when the second power domain is on, and the second power domain is off in at least one functional mode in which the first power domain is on;

setting the second test signal to logic 0;

deasserting the first test signal to disable the first isolation cell;

after setting the second test signal to logic 0 and deasserting the first test signal, measuring a second voltage at the first pin or pad;

setting a first test bit of the first power domain to logic 0, wherein the first test bit is coupled to a first input of an OR gate, the OR gate having a second input coupled to the signal output of the first isolation cell and to the first pin or pad, and an output coupled to an input of a test controller, wherein the second power domain comprises the OR gate and the test controller;

after setting the second test signal to logic 0, deasserting the first test signal, and setting the first test bit to logic 0, measure a third voltage at a second pin or pad coupled to an output of the test controller, wherein the second power domain comprises the second pin or pad;

when the first voltage corresponds to logic 0, the second voltage correspond to logic 0, and the third voltage is indicative of the test controller being in reset mode, generating a first indication that a first path coupled to the signal input of the first isolation cell does not have stuck-at 1 faults, and that a second path coupled to the signal output of the first isolation cell does not have stuck-at 1 faults;

when the first voltage corresponds to logic 0 and the second voltage correspond to logic 1, generating a second indication that the first path has a stuck-at 1 fault; and when the first voltage corresponds to logic 0, the second voltage correspond to logic 0, and the third voltage is indicative of the test controller not being in reset mode, generating a third indication that the second path has a stuck-at 1 fault.

23. The method of claim 22, further comprising, during the first test mode:

when the first voltage corresponds to logic 1;

asserting a third test signal to enable a second isolation cell;

after asserting the third test signal and setting the second test signal to logic 1, measuring a fourth voltage at the first pin or pad; and when the fourth voltage corresponds to logic 0, generating an indication that the first isolation cell is connected incorrectly.

24. The method of claim 22, wherein generating the first, second, or third indications comprises generating a log file with an automated test equipment (ATE).

* * * * *